US006636542B1

(12) United States Patent
Ueki

(10) Patent No.: US 6,636,542 B1
(45) Date of Patent: Oct. 21, 2003

(54) SURFACE EMITTING SEMICONDUCTOR LASER, SURFACE EMITTING SEMICONDUCTOR LASER ARRAY, AND METHOD FOR MANUFACTURING SURFACE EMITTING SEMICONDUCTOR LASER

(75) Inventor: Nobuaki Ueki, Nakai-machi (JP)

(73) Assignee: Fuji Xerox Co., Ltd., Tokyo (JP)

(*) Notice: Subject to any disclaimer, the term of this patent is extended or adjusted under 35 U.S.C. 154(b) by 0 days.

(21) Appl. No.: 09/250,305

(22) Filed: Feb. 16, 1999

(30) Foreign Application Priority Data

Feb. 17, 1998 (JP) .......................... 10-034903
Jan. 25, 1999 (JP) .......................... 11-016197

(51) Int. Cl.[7] ............................... H01S 5/00
(52) U.S. Cl. ........................................... 372/46
(58) Field of Search ............... 372/46, 50, 45; 438/32

(56) References Cited

U.S. PATENT DOCUMENTS

| 5,331,654 A | * | 7/1994 | Jewell et al. | ........... 372/45 |
| 5,493,577 A | * | 2/1996 | Choquette et al. | ........... 372/46 |
| 5,879,961 A | * | 3/1999 | Scott | ........... 438/32 |
| 5,881,085 A | * | 3/1999 | Jewell | ........... 372/46 |

FOREIGN PATENT DOCUMENTS

| JP | B2-7-73139 | 8/1995 |
| JP | B2-2701596 | 10/1997 |

* cited by examiner

Primary Examiner—Quyen Leung
(74) Attorney, Agent, or Firm—Oliff & Berridge, PLC

(57) ABSTRACT

A surface emitting semiconductor laser and a method for manufacturing a surface emitting semiconductor laser array which are capable of controlling the polarization plane of a laser beam in constant direction and obtaining a low threshold current are provided. The surface emitting semiconductor laser is provided with a first reflection mirror layer of the first conduction type formed on the main plane of a semiconductor substrate, an active layer having a quantum well laminated above the first reflection mirror layer, a post having a second reflection mirror layer of the second conduction type different from the first conduction type for constituting an resonator structure together with the first reflection mirror, and plurality of peripheral high resistance layers having the periphery of high resistance inserted between the first reflection mirror layer and the second reflection mirror layer, and which plurality of peripheral high resistance layers are different from each other in proportion of non-high resistance in the plane parallel to the main plane of the semiconductor substrate.

12 Claims, 18 Drawing Sheets

SURFACE EMITTING SEMICONDUCTOR LASER, SURFACE EMITTING SEMICONDUCTOR LASER ARRAY, AND METHOD FOR MANUFACTURING SURFACE EMITTING SEMICONDUCTOR LASER

BACKGROUND OF THE INVENTION

1. Field of the Invention

This invention relates to a surface emitting semiconductor laser, a surface emitting semiconductor laser array, and a method for manufacturing a surface emitting semiconductor laser, and more particularly, relates to a surface emitting semiconductor laser, a surface emitting semiconductor laser array, and a method for manufacturing a surface emitting semiconductor laser which are of polarization plane control type used as a light source of optical information processing devices, optical communication devices, and image forming devices using light.

2. Description of the Related Art

While a circular emitting spot is usually required in the laser application technology, a surface emitting semiconductor laser, featured in that the emitting spot is formed easily in a circular shape, has attracted much attention recently because of convenience as a light source which is capable of two-dimensional accumulation. A surface emitting semiconductor laser usually has the isotropic physical configuration in the perpendicular direction to the emitting surface (high axial symmetry), and such configuration leads to no difference in characteristics with respect to two orthogonal axial directions (referred to as two axial directions hereinafter) in the plane horizontal to the emitting surface. As the result, it is known that the polarization plane is directed to the two axial directions in the same probability.

The direction to the two axial directions in the same probability results in impossibility to use polarization-dependent optical elements such as lenses having no special coating and polarization beam splitters as they are, and when many elements are used in the same optical system, the difference of polarization plane between elements is reflected disadvantageously on the light quantity variation, and to avoid such problem various methods have been developed to stabilize the polarization plane in one direction.

Japanese Patent Publication No. 2701596 is an example of such method. In this method, as shown in FIG. 25, the first reflection mirror layer 52 doped with n-type impurity comprising a multi-layer film formed by laminating GaAs layers and AlAs layers alternately, an active layer 70 having an InGaAs layer 56 which is served as a quantum well and provided between two AlGaAs layers 54 and 58, and the second reflection mirror layer 64 doped with p-type impurity comprising a multi-layer film formed by laminating GaAs layers and AlAs layers and a metal electrode layer are formed on a GaAs substrate 50, and the second reflection mirror layer 64 and the active layer 70 are mesa-etched to form a square post 60 served as a vertical resonator structure, and metal films 8a and 8b are provided partially on the mesa side of the post 60 to cause the difference in resonator loss, and thus the light is oscillated in the specified polarization direction and the polarization plane is directed in one direction.

Japanese Published Examined Patent Application No. Hei 7-73139 is another example of such method. In this method, as shown in FIG. 26(b) and FIG. 26(c), an n-type AlAs/ GaAs distribution Bragg reflecting mirror (referred to as DBR hereinafter) 52, an n-type $Al_{0.4}Ga_{0.6}As$ layer 54, an $In_{0.2}Ga_{0.8}As$ active layer 56, a p-type $Al_{0.4}Ga_{0.6}As$ layer 58, and a p-type AlAs/GaAs DBR 64 are formed successively on an n-type GaAs substrate 50, and the n-type $Al_{0.4}Ga_{0.6}As$ layer 54, the $In_{0.2}Ga_{0.8}As$ active layer 56, the p-type $Al_{0.4}Ga_{0.6}As$ layer 58, and the p-type AlAs/GaAs DVR 64 are mesa-etched to form a square post 60 served as a vertical resonator structure, and when SiN film 72 is formed on the mesa-sides of the post 60, the temperature is kept at 300° C. on one pair of facing sides and at 100° C. on another pair of facing sides.

Because the tensile stress exerted on the post 60 is different between the above-mentioned two axial directions when the temperature is cooled down to the room temperature, the stress exerted in the two axial directions in the active layer plane horizontal to the emitting surface is different, one polarization mode out of two axial directions is diminished to stabilize the polarization plane to one direction.

However, because conventional surface emitting semiconductors have the air post structure, if the post diameter is reduced to reduce the threshold current then the optical-output is reduced undesirably, and on the other hand, if the post diameter is increased to obtain desired optical output then the threshold current increases and the horizontal mode becomes unstable un:desirably, so it is difficult to obtain a surface emitting semiconductor laser with reduced threshold current.

In the methods described hereinabove, the metal films 8a and 8b or SiN film 72 are formed on the mesa side which is approximately perpendicular to the semiconductor substrate plane, however, since it is difficult to form an even film reproducibly on a side approximately perpendicular to the semiconductor substrate plane and it requires special high level technique, these methods are not preferable from the viewpoint of reliability for accurate manufacturing of elements.

It is the first object of the present invention to provide a surface emitting semiconductor laser and a surface emitting semiconductor laser array which are capable of controlling the polarization plane of a laser beam to one direction and obtaining a low threshold current. It is the second object of the present invention to provide a method for manufacturing a surface emitting semiconductor laser which is capable of controlling the polarization plane of a laser beam to one direction and enhancing element performance.

SUMMARY OF THE INVENTION

To accomplish the above-mentioned first object, A surface emitting semiconductor laser, comprising: a semiconductor substrate; a first reflection mirror layer of the first conduction type formed on the main plane of the semiconductor substrate; an active layer having a quantum well laminated above the first reflection mirror layer; a post having a second reflection mirror layer of the second conduction type different from the first conduction type for constituting an resonator structure together with the first reflection mirror; a plurality of peripheral high resistance layers having a periphery of high resistance and inserted between the first reflection mirror layer and the second reflection mirror layer; and wherein at least two layers of the plurality of peripheral high resistance layers are different in the proportion of non-high resistance therein.

As described above, because plurality of peripheral high resistance layers having the periphery of high resistance inserted between the first reflection mirror layer and the second reflection mirror layer are formed and at least two layers out of the plurality of peripheral high resistance layers are different from each other in proportion of non-high resistance to give the stress different in reflectance distribution and intensity between orthogonal two axial directions, as the result, anisotropy in oscillation threshold gain is caused, only the mode in the direction of smaller threshold gain is obtained selectively, and the polarization plane of the laser beam is fixed in the constant direction.

Because the high resistance area is not conductive, a refractive index waveguide in which a current is narrowed and a beam is confined in the different proportion between the two axial directions orthogonal in the plane parallel to the main plane of the semiconductor substrate is formed, and the element performance of improved low threshold current is obtained.

The proportion of non-high resistance termed in the present invention means the proportion of non-high resistance determined depending on the depth or thickness of the high resistance area and chemical composition of the high resistance area, and includes all the factors that influence the stress exerted on the active layer.

The surface emitting semiconductor laser described above can be comprised at least two layers of the plurality of peripheral high resistance layers are different in the shape of non-high resistance area in the plane parallel to the main plane of the semiconductor substrate.

The surface emitting semiconductor laser described above can be comprised a periphery of high resistance is oxide of the composite of the non-high resistance area.

Because it is known that a layer having a high Al content is easily oxidized by means of high temperature heat treatment in a steam atmosphere and is different in oxidation rate from other layers, only the desired layer is oxidized selectively. Based on the selectivity, the peripheral high resistance layer is formed easily.

The surface emitting semiconductor laser described above can be comprised at least one of the peripheral high resistance layers has the periphery of high resistance which is different in proportion between arbitrary two axial directions orthogonal in the plane parallel to the main plane of the semiconductor substrate.

The layer described hereinabove functions to easily give the stress different in reflectance distribution and intensity between the orthogonal two axial direction to the active layer to cause anisotropy in oscillation threshold gain, only the mode in the direction of the smaller threshold gain is obtained selectively and the polarization of the laser beam is fixed in the constant direction.

The surface emitting semiconductor laser described above can be comprised the shape of the non-high resistance area of at least one of the peripheral high resistance layers in the plane parallel to the main plane of the semiconductor substrate is regular polygonal or regular circular.

The above-mentioned plurality of peripheral high resistance layers are by no means limited as long as at least two layers out of the plurality of peripheral resistance layers are different in proportion of non-high resistance, all layers may be layers having the periphery of high resistance different in proportion between arbitrary orthogonal two axial directions in the plane parallel to the main plane of the semiconductor substrate, or may be combination of a layer having the periphery of high resistance different in proportion between the arbitrary orthogonal two axial directions and a layer having the non-high resistance area in the shape of regular polygon or regular circle in the plane parallel to the main plane of the semiconductor substrate.

The surface emitting semiconductor laser described above can be comprised the shape of the post in the plane parallel to the main plane of the semiconductor substrate is regular polygonal or regular circular.

Because, in the present invention, plurality of peripheral high resistance layers having the periphery of high resistance inserted between the first reflection mirror layer and the second reflection mirror layer are provided and at least two layers out of the plurality of peripheral high resistance layers are different in non-high resistance area to give the stress different in reflectance distribution and intensity between the orthogonal two axial directions to the active layer even if the shape of the post in the plane parallel to the main plane of the semiconductor substrate is regular polygonal or regular circular, as the result, anisotropy in oscillation threshold gain is caused, only the mode in the direction of the smaller threshold gain is obtained selectively, and the polarization plane of the laser beam is fixed in the constant direction.

A surface emitting semiconductor laser array can be obtained by arranging a plurality of the surface emitting semiconductor lasers described above on the same one semiconductor substrate.

Because the polarization plane of the laser emitted from the surface emitting semiconductor laser of the present invention is fixed in the constant direction, the variation of polarization plane between elements is reduced, and the variation in beam quantity on a surface emitting semiconductor laser array is reduced.

To accomplish the above-mentioned second object of the present invention, a method for manufacturing a surface emitting semiconductor laser, comprising: a lamination step for forming a laminate on a main plane of a semiconductor substrate, wherein a first reflection mirror layer of a first conduction type, an active layer having a quantum well, and a second reflection mirror layer of a second conduction type different from the first conduction type, wherein second reflection mirror layer constitutes a resonator structure together with the first reflection mirror, are formed successively, and an insertion layer having an Al content higher than those of other layers of the laminate is formed between the first reflection mirror layer and the second reflection mirror layer during the laminate is being formed; an etching step for forming a protrusion by removing the laminate partially by means of etching until the top surface or side surface of the insertion layer is exposed so that the protrusion has the minor axis in one of the arbitrary two axial directions orthogonal in the plane parallel to the main plane of the semiconductor substrate; a first selective oxidation step for rendering the insertion layer highly resistant by oxidizing the insertion layer from the side-surface intersecting with the minor axis of the protrusion; a post forming step for forming a post by etching the side-surface intersecting the major axis of the protrusion until the top surface or side surface of the insertion layer is exposed; and a second selective oxidation step for oxidizing the insertion layer exposed to the side surface of the post from the side-surface to render the periphery of the insertion layer high resistant.

According to the method described above, a surface emitting semiconductor laser having the peripheral high resistance area having the periphery of high resistance different in proportion between the two axial directions orthogonal in the plane parallel in the main plane of the semiconductor substrate can be manufactured relatively easily through two etching processes and two selective oxidation processes.

To accomplish the above-mentioned second object of the present invention, the other method for manufacturing a surface emitting semiconductor laser, comprising: a lamination step for forming a laminate on a main plane of a semiconductor substrate, wherein a first reflection mirror layer of a first conduction type, an active layer having a quantum well, and a second reflection mirror layer of a second conduction type different from the first conduction type, wherein second reflection mirror layer constitutes a resonator structure together with the first reflection mirror, are formed successively, and a plurality of insertion layers having an Al content higher than those of other layers of the laminate is formed between the first reflection mirror layer and the second reflection mirror layer during the laminate is being formed; an etching step.for forming a protrusion by etching the laminate partially until the top surface or side surface of at least one of the insertion layers is exposed so that the protrusion has the minor axis in one of the arbitrary two axial directions orthogonal in the plane parallel to the main plane of the semiconductor substrate; a first selective oxidation step for oxidizing the exposed insertion layer from the side-surface intersecting with the minor axis of the protrusion to render the exposed insertion layer highly resistant; a post forming step for forming a post by etching the side-surface intersecting the major axis of the protrusion until the top surface or side surface of the rest of insertion layers is exposed; and a second selective oxidation step for oxidizing the insertion layer exposed to the side surface of the post from the side-surface to render the periphery of the plurality of insertion layers high resistant.

According to the method described above, the surface emitting semiconductor laser having the structure in which plurality of peripheral high resistance layers having the periphery of high resistance inserted between the first reflection mirror layer and the second reflection mirror layer are formed and at least two layers out of the plurality of peripheral high resistance layers are different in proportion of non-high resistance as described in claim 1 to claim 6, is easily manufactured through two etching processes and two selective oxidation processes.

The invention described above can be comprised selective oxidation is carried out so that the shape of the non-high resistance area in the plane parallel to the main plane of the semiconductor substrate of at least one the insertion layer is regular polygonal or regular circular or the shape of the post in the plane parallel to the main plane of the semiconductor substrate is formed regular polygonal or regular circular by the post forming step.

The invention described above can be comprised the periphery of the insertion layer is oxidized differently in proportion between the two axial directions orthogonal in the plane parallel to the main plane of the semiconductor substrate by causing the difference in the degree of oxidation between the first selective oxidation step and the second oxidation step.

BRIEF DESCRIPTION OF THE DRAWINGS

FIG. 2 (b) is a cross sectional view along the line B—B in the arrow direction of the surface emitting semiconductor laser in accordance with the first embodiment of the present invention shown in FIG. 2.

FIG. 10 (b) is a cross sectional view along the line B—B in the arrow direction of the surface emitting semiconductor laser in accordance with the second embodiment of the present invention.

FIG. 18 (b) is a cross sectional view along the line A—A in the arrow direction in F,IG. 18(a).

FIG. 18 (c) is a cross sectional view along the line B—B in the arrow direction in FIG. 18(a).

FIG. 26 (b) is a cross sectional view along the line A—A in the arrow direction in FIG. 26(a).

FIG. 26 (c) is a cross sectional view along the line B—B in the arrow direction in FIG. 26(a).

DETAILED DESCRIPTION OF THE INVENTION

Embodiments of the present invention will be described in detail with reference to FIG. 1 to FIG. 24 hereinafter. In all the drawings, the same or equivalent components are given the same characters.

First Embodiment

Figure 1:
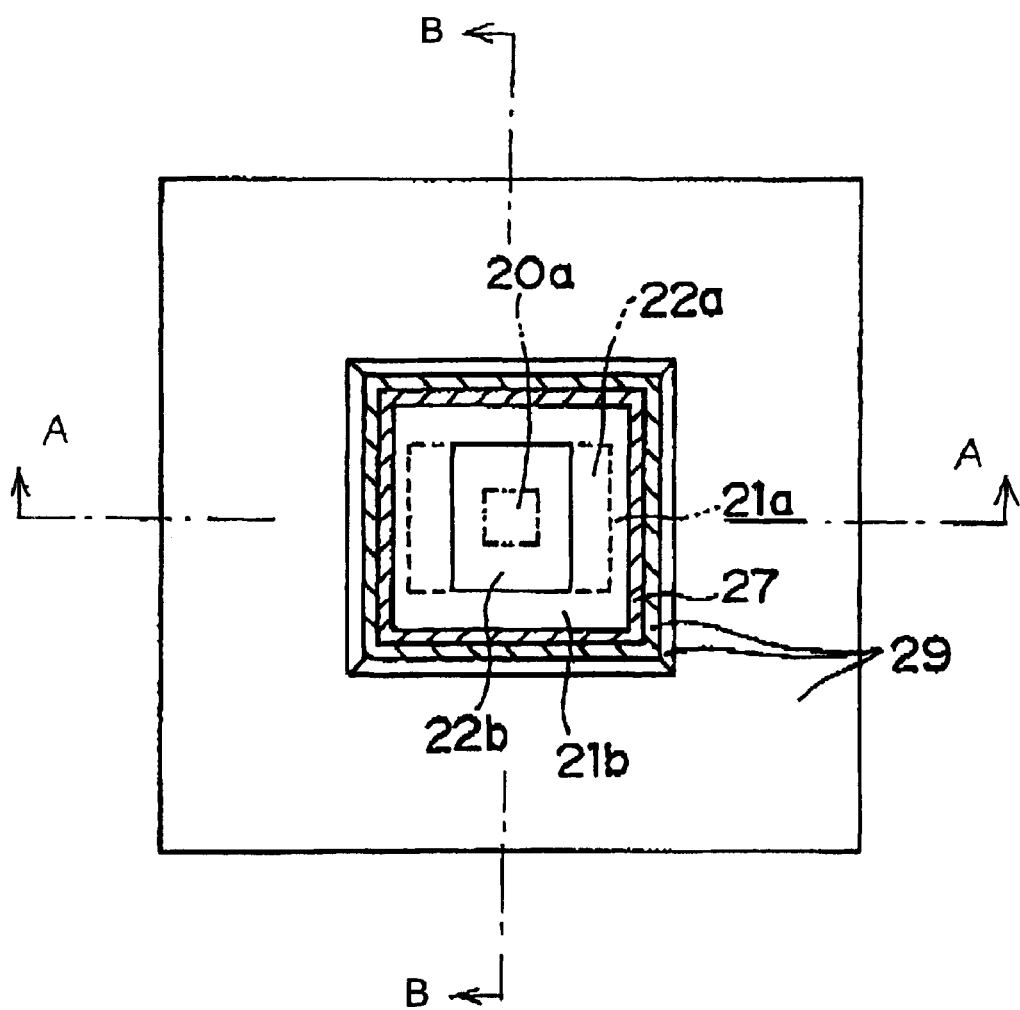
FIG. 1 is a top view of a surface emitting semiconductor laser in accordance with the first embodiment of the present invention.

The first embodiment is described with reference to FIG. 1 to FIG. 8. FIG. 1 is a top view for illustrating the schematic structure of a surface emitting semiconductor laser in accordance with the first embodiment, FIG. 2 is a cross sectional view in the two axial directions in accordance with the first embodiment, and FIG. 3 to FIG. 9 show the schematic manufacturing process of a surface emitting semiconductor laser in accordance with the first embodiment.

Figure 2A:
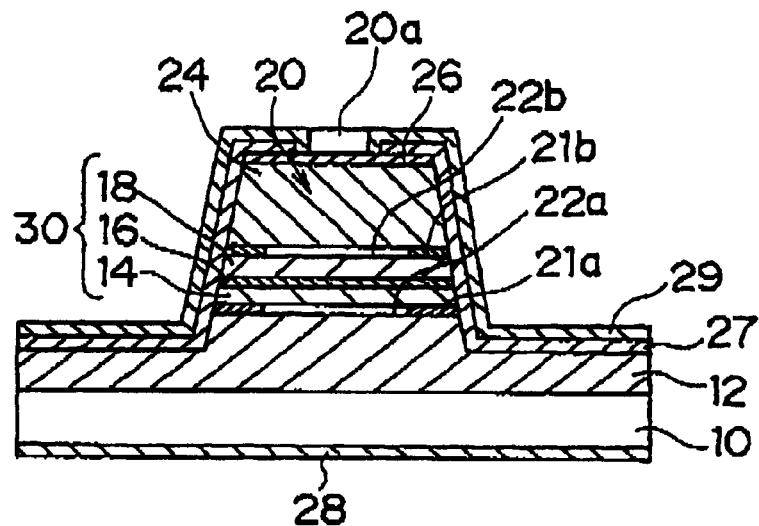
FIG. 2 (a) is a cross sectional view along the line A—A in the arrow direction of the surface emitting semiconductor laser in accordance with the first embodiment of the present invention shown in FIG. 1.
Figure 2B:
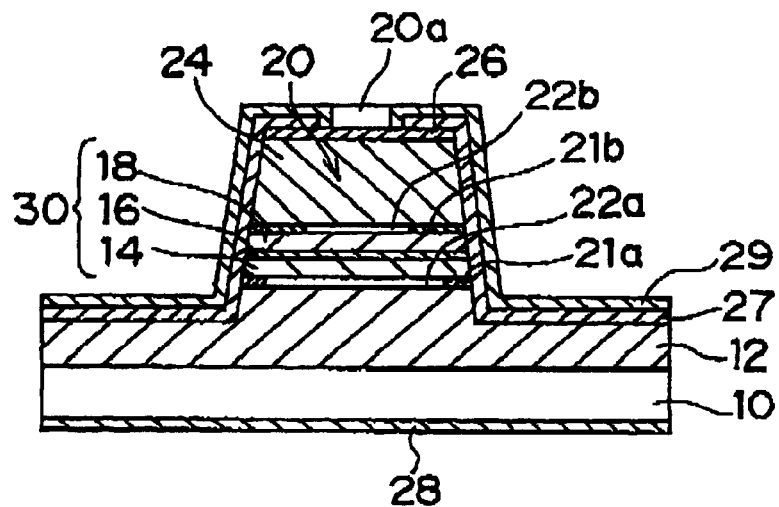

As shown in FIG. 1, the surface emitting semiconductor laser of the first embodiment is an element provided with a square post 20 with the top having an aperture 20a for emitting a beam, and as shown in FIG. 2(a) and FIG. 2 (b), an n-type first reflection mirror layer 12 having carrier concentration of $2 \times 10^{18}$ cm$^{-3}$ formed by laminating n-type $Al_{0.9}Ga_{0.1}As$ films of $\lambda/(4n_r)$ ($\lambda$: oscillation wavelength, $n_r$: refractive index of medium) in thickness doped with n-type impurity Si (silicon) not shown in detail and n-type $Al_{0.3}Ga_{0.7}As$ films of $1/(4n_r)$ in thickness alternately up to 40.5 periods is provided on an n-type GaAs substrate 10 having an n-side electrode 28 on the back side.

On the top of the n-type first reflection mirror 12 and on the center of a spacer layer consisting of undoped $Al_{0.5}Ga_{0.5}As$ (not shown in the drawing), a quantum well active layer 16 having a quantum well layer formed by laminating four undoped $Al_{0.3}Ga_{0.7}As$ barrier films of 5 nm in thickness and three undoped $Al_{0.11}Ga_{0.8}9As$ films of 8 nm alternately is provided.

The quantum well active layer 16 has a film thickness of an integral multiple of $\lambda/n_r$ so that a standing wave is obtained. As the result, the antinode where the optical intensity is maximum is positioned at the quantum well layer when the surface emitting semiconductor laser is operated (not shown in the drawing).

On the top of the quantum well active layer 16, the p-type second reflection mirror layer 24 having a carrier concentration of $3 \times 10^{18}$ cm$^{-3}$ formed by laminating p-type $Al_{0.9}Ga_{0.1}As$ films doped with C (carbon) of $\lambda/(4n_r)$ in thickness and p-type $Al_{0.3}Ga_{0.7}As$ films of $\lambda/(4n_r)$ in thickness with interposition of intermediate layer having an Al content between those of the above-mentioned two films alternately up to 30 periods, which is not shown in detail in the drawing, and a p-type GaAs contact layer 26 having a film of 10 nm in thickness and a carrier concentration of $1 \times 10^{20}$ cm$^{-3}$ doped with C (carbon) are provided.

A substrate having such layer structure is processed to form an approximately square post 20. The post 20 has an AlAs peripheral oxidized areas 21a and 21b where the periphery is oxidized in a different degree between the two directions orthogonal in the plane parallel in the main plane of the n-type GaAs substrate 10. The layer which is to be the peripheral oxidized areas 21a and 21b is prescribed to have an Al content higher than those of the $Al_{0.9}Ga_{0.1}As$ film and the $Al_{0.3}Ga_{0.7}As$ film which are components of the reflection mirror layers so as to be more sensitive to heat treatment in a steam atmosphere.

The p-type second reflection mirror layer 24 has a smaller number of periods (number of layers) than the above-mentioned n-type first reflection mirror layer 12 so that the reflectance of the second reflection mirror layer 24 is smaller than that of the n-type first reflection mirror layer 12. The difference in reflectance allows the beam to come out from the top surface of the post 20. The intermediate layers provided between respective p-type $Al_{0.9}Ga_{0.1}As$ films and p-type $Al_{0.3}Ga_{0.7}As$ films which are components of the p-type second reflection mirror layer 24 not shown in the drawing function to reduce the series resistance of the element. The p-type GaAs contact layer 26 provided on the uppermost position is formed to keep in contact with the p-side electrode 29 with the insulating protective layer film 27 interposed.

A manufacturing process of a surface emitting semiconductor laser having the structure as described hereinabove is described with reference to FIG. 3 to FIG. 9 hereinafter.

Figure 3:
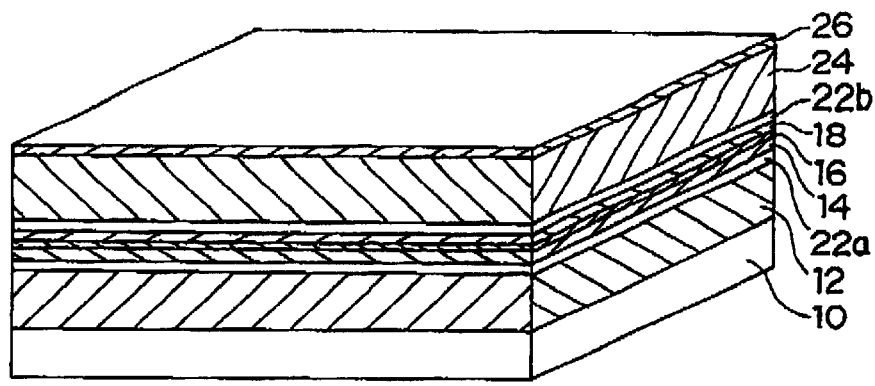
FIG. 3 is a schematic view after a lamination process in a method for manufacturing the surface emitting semiconductor laser in accordance with the first embodiment of the present invention.

As shown in FIG. 3, on the n-type GaAs substrate 10, the n-type first reflection mirror 12 having the structure formed by laminating n-type $Al_{0.9}Ga_{0.1}As$ films (not shown in the drawing) doped with Si (silicon) and n-type $Al_{0.3}Ga_{0.1}As$ films (not shown in the drawing) alternately, the first AlAs layer 22a having an Al content higher than those of the $Al_{0.3}Ga_{0.7}As$ films (not shown in the drawing) and the $Al_{0.3}Ga_{0.7}As$ films (not shown in the drawing) which are components of the n-type first mirror layer 12, the quantum well active layer 16 having the quantum layer on the center area of the spacer layer (not shown in the drawing) consisting of undoped $Al_{0.5}Ga_{0.5}As$, the second AlAs layer 22b having a higher Al content than those of the $Al_{0.9}Ga_{0.7}As$ films (not shown in the drawing) and the $Al_{0.3}Ga_{0.1}As$ films (not shown in the drawing) which are components of the p-type second reflection mirror layer 24 described hereinafter, the p-type second reflection mirror layer 24 having the structure formed by laminating p-type $Al_{0.9}Ga_{0.1}As$ films doped with C (carbon) and the p-type $Al_{0.3}Ga_{0.7}As$ films with interposition of intermediate layers alternately, and the p-type GaAs contact layer 26 doped with high concentration C (carbon) are formed successively in the form of layer by means of semiconductor crystal growing technology such as organometal vapor phase deposition (MODVD) or molecular beam epitaxy (MBE) (lamination process).

Figure 4:
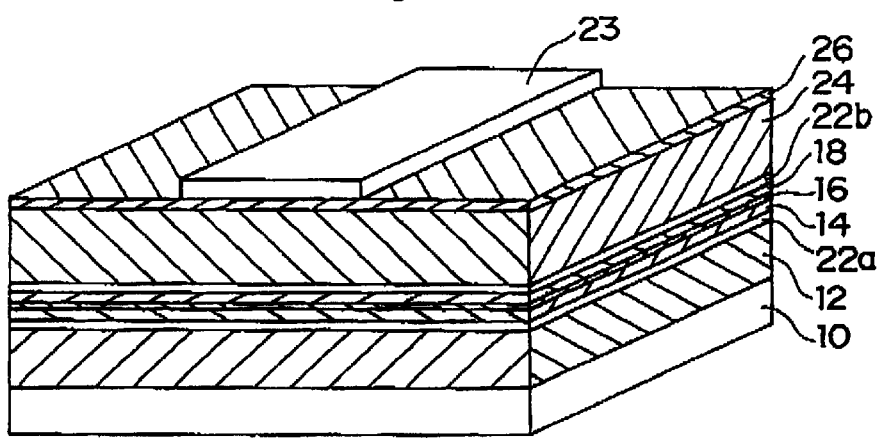
FIG. 4 is a schematic view after a first mask forming process in the method for manufacturing the surface emitting semiconductor laser in accordance with the present invention.
Figure 5:
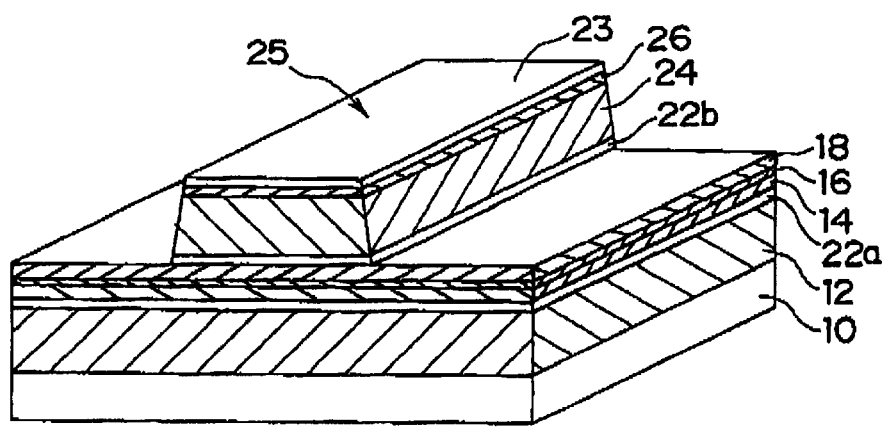
FIG. 5 is a schematic view after an etching process in the method for manufacturing the surface emitting semiconductor laser in accordance with the first embodiment of the present invention.

The silicon insulating film 23 is deposited on the entire surface of the above-mentioned laminated film, photoresist having a width of 20 to 50 $\mu$m is formed including the area which will be finally the top surface of the post 20 by means of photolithography, the silicon insulating film 23 is etched in the form of stripe to form the first mask 23 as shown in FIG. 4, the resultant laminate is subjected to reactive ion etching by use of this first mask 23 as a mask until the top surface or side surface of the second AlAs layer 22b is exposed to form a ridge as shown in FIG. 5 (first etching process).

Figure 6:
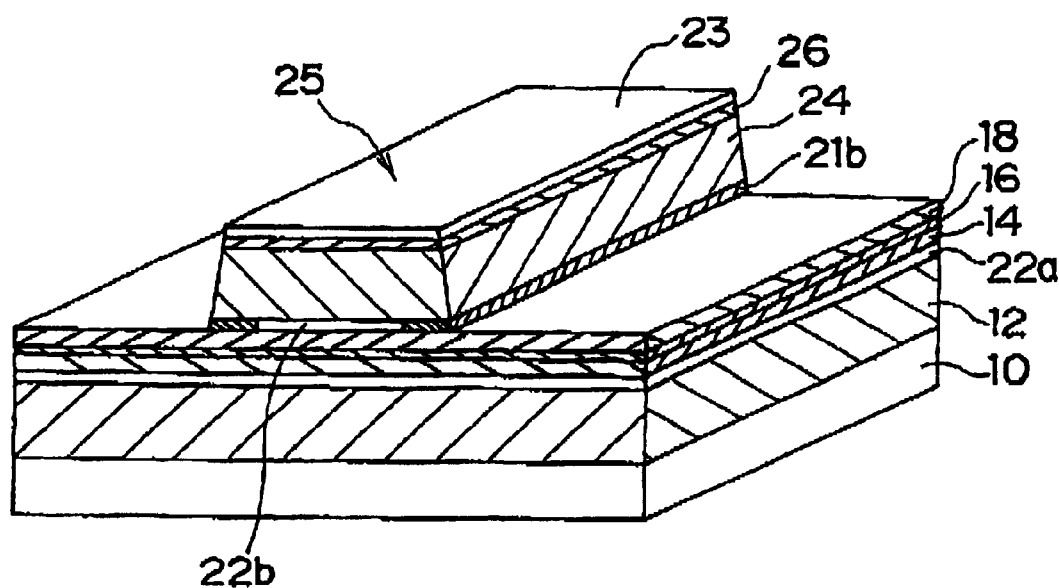
FIG. 6 is a schematic view after a first oxidation process in the method for manufacturing the surface emitting semiconductor laser in accordance with the first embodiment of the present invention.

Afterward, the resultant laminate is heated at 380° C. in a quartz tube filled with steam for 5 to 10 minutes. When, the AlAs layer 22b exposed on the ridge is oxidized gradually from the top surface and side surface at the same speed toward the inside as shown in FIG. 6, and the peripheral oxidized area 21b is formed (first selective oxidation process).

Figure 7:
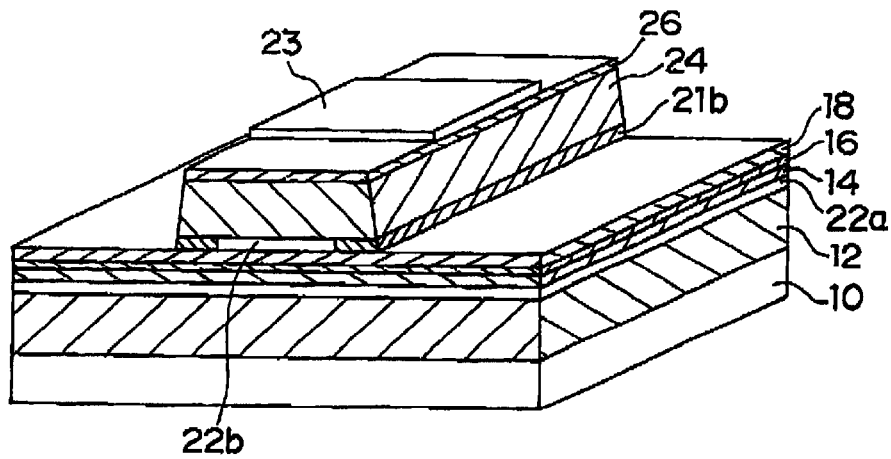
FIG. 7 is a schematic view after a second mask forming process in the method for manufacturing the surface emitting semiconductor laser in accordance with the first embodiment of the present invention.

Further, as shown in FIG. 7, the silicon insulating film 23 on the top surface of the ridge is etched into a desired post planer shape by means of photolithography.

Figure 8:
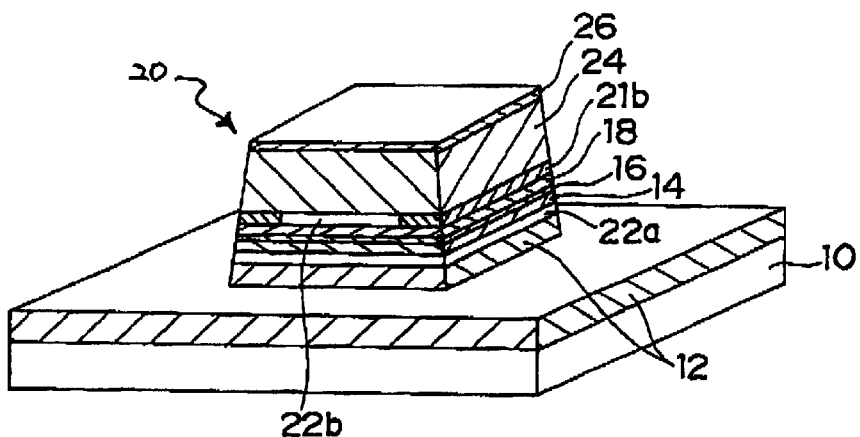
FIG. 8 is a schematic view after a post forming process in the method for manufacturing the surface emitting semiconductor laser in accordance with the first embodiment of the present invention.

Subsequently, as shown in FIG. 8, the resultant laminate is subjected to reactive ion etching with use of the etched silicon insulating film 23 as the second mask to form the square post 20 having the mesa structure (second etching process).

Before the post 20 is formed, the edge of the peripheral oxidized area 21b was exposed linearly in parallel to the main plane of the GaAs substrate 10 on the side surface of the ridge, however, the longitudinal ridge including the peripheral oxidized area 21b is removed during the above-mentioned post forming process, the removal results in the structure that the linear peripheral oxidized area 21b parallel to the main plane of the GaAs substrate 10 and the edge of the unoxidized first AlAs layer 22a are exposed to a pair of facing two side surfaces out of the four side surfaces of the post 20 obtained during the post forming process, and on the other hand, the edges of unoxidized second AlAs layer 22b and first AlAs layer 22a are exposed to another pair of facing two side surfaces out of the four side surfaces of the post 20 obtained during the post forming process.

Afterward, the resultant laminate is subjected again to heat treatment at 380° C. for 5 to 10 minutes in a quartz tube filled with steam to oxidize the second AlAs layer 22b and first AlAs layer 22a selectively (second selective oxidation process).

Figure 9:
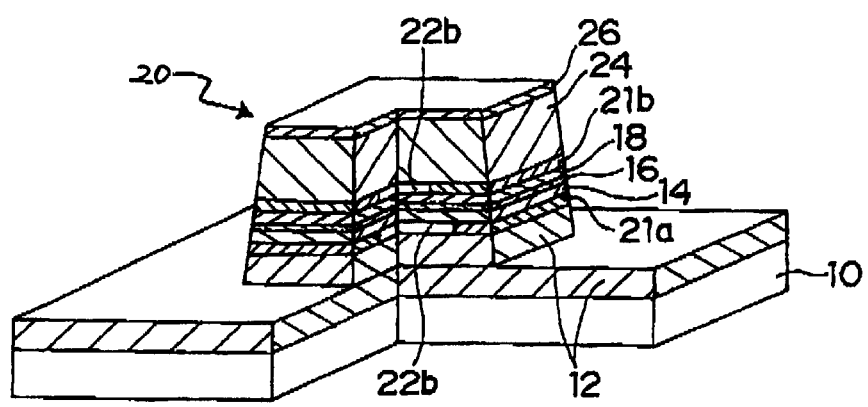
FIG. 9 is a schematic view after a second oxidation process in the method for manufacturing the surface emitting semiconductor laser in accordance with the first embodiment of the present invention.

In the heat treatment, as shown in FIG. 9, the second AlAs layer 22b (including peripheral oxidized area 21b) and the first AlAs layer 22a, which are exposed to the four side surfaces of the post 20, are oxidized gradually from the side surface to the inside. The side where the linear peripheral oxidized area 21b has been already formed in parallel to the main plane of the GaAs substrate 10 which is exposed to the pair of facing two side surfaces of the post 20 is oxidized further during the second selective oxidation process so that the peripheral oxidized area 21b extends closely to the center of the post 20. Of the four side surfaces of the post 20, portions, which have not been oxidized on the pair of facing two side surfaces and have been formed newly during the post forming process, are oxidized newly so that a peripheral oxidized area is newly formed. The new peripheral oxidized area is resultantly the area where the oxidation proceeds less on the new area than on one of the peripheral oxidized areas formed from another pair of two sides. Accordingly, the peripheral oxidized areas 21a and 21b which are different from each other in the degree of oxidation between orthogonal two axial directions are formed resultantly in the plane parallel to the main plane of the GaAs substrate 10 on the second AlAs layer 22b and the first AlAs layer 22a respectively.

Subsequently, the p-side electrode 29 on which an aperture for allowing the beam to come out upward from the top surface of the post 20 is formed on the surface side of the GaAs substrate 10 with interposition of the insulating protective film 27 and the n-side electrode 28 is formed on the entire back surface of the GaAs substrate to obtain a surface emitting semiconductor laser having an oscillation wavelength of $\lambda$ to 780 nm as shown in FIG. 1 and FIG. 2.

Second Embodiment

Figure 10A:
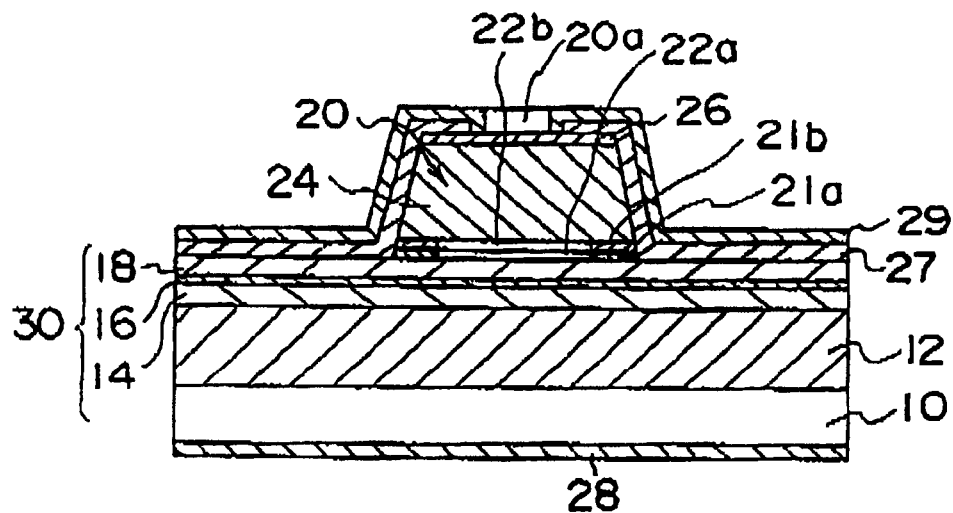
FIG. 10 (a) is a cross sectional view along the line A—A in the arrow direction of the surface emitting semiconductor laser in accordance with the second embodiment of the present invention.
Figure 10B:
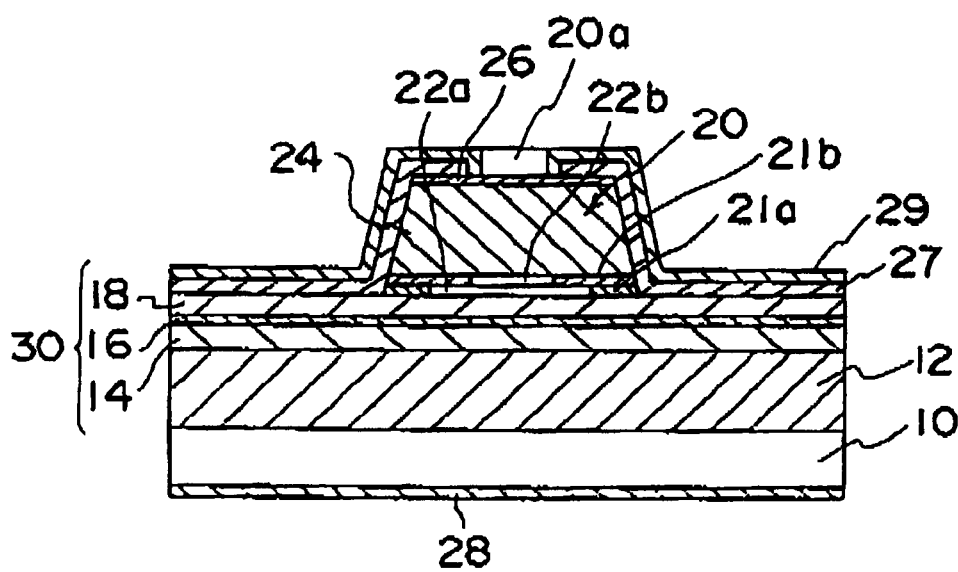

The second embodiment will be described in detail with reference to FIG. 10 to FIG. 16 hereinafter. The second embodiment is a modified example on the basis of the above-mentioned first embodiment wherein the first AlAs layer 22b and the second AlAs layer 22a having the periphery which is to be oxidized to form the peripheral oxidized areas 21b and 21a as described in the surface emitting semiconductor laser of the first embodiment are laminated on one of the top side and bottom side of the spacer with interposition of an intermediate layer, not shown in the drawing, having an Al content between those of the above-mentioned two films as shown in FIG. 10.

The second AlAs layer 22b out of the first AlAs layer 22a and the second AlAs layer 22b is an AlAs layer having the peripheral area where the oxidized area 22b is formed in different proportion between orthogonal two axial directions in the plane parallel to the main plane of the GaAs substrate 10, and the first AlAs layer 22a is an AlAs layer having the peripheral area where the oxidized area 21a is formed in the same proportion in the orthogonal two axial directions in the plane parallel to the main plane of the GaAs substrate 10.

The layer which includes two AlAs layers having the peripheral oxidized areas 21a and 21b on the top surface of the active layer 30 exerts the stronger stress on the active layer 30 than the structure of the above-mentioned first embodiment. Because anisotropy in oscillation threshold value gain is obtained more effectively, only the mode in the axial direction which gives the smaller threshold gain is obtained selectively, current narrowing and optical confinement are performed more effectively in different proportion between the two axial directions orthogonal in the plane parallel to the main plane of the GaAs substrate 10, and the laser element operable with low threshold current at a consistent polarization direction is obtained. The other structural components are the same as those of the surface emitting semiconductor laser of the first embodiment.

The manufacturing process of a surface emitting semiconductor laser having the above-mentioned structure is described with reference to FIG. 11 to FIG. 16 hereinafter. The structure of the n-type first reflection mirror layer 12, the active layer 30, the second reflection mirror layer 34, and contact layer 26, and the composition before selective oxidation of two AlAs layers (first AlAs layer 22a and second AlAs layer 22b) are the same as those described in the first embodiment, and the description is omitted.

Figure 11:
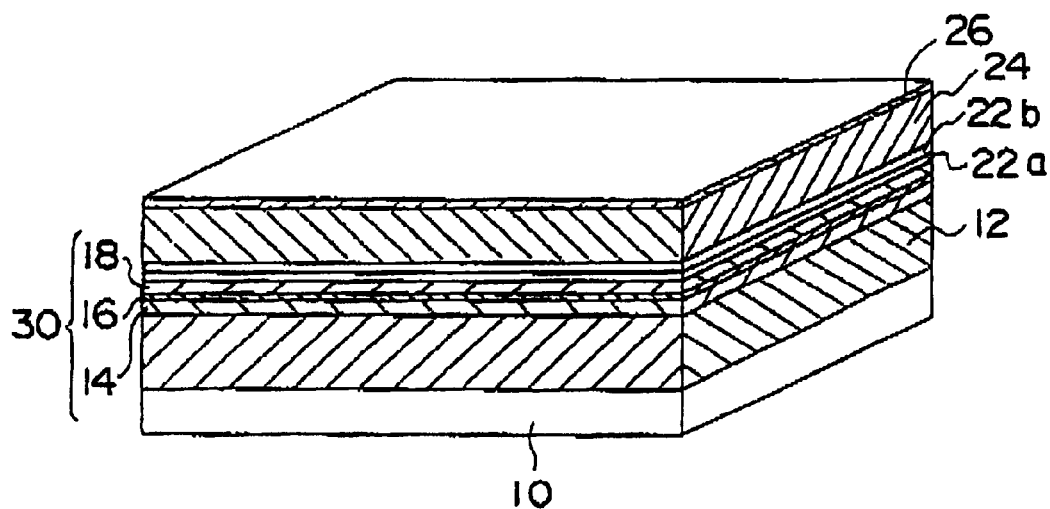
FIG. 11 is a schematic view after a lamination process in the method for manufacturing the surface emitting semiconductor laser in accordance with the second embodiment of the present invention.

As shown in FIG. 11, the n-type first reflection mirror layer 12, the active layer 30, two AlAs layers 22a and 22b, the p-type second reflection mirror layer 24, and the p-type GaAs contact layer 26 are formed successively in the form of layer on the n-type GaAs substrate 10 by means of semiconductor crystal growing technology such as organometal vapor phase deposition (MOCVD) or molecular beam epitaxy (MBE) (lamination process).

Figure 12:
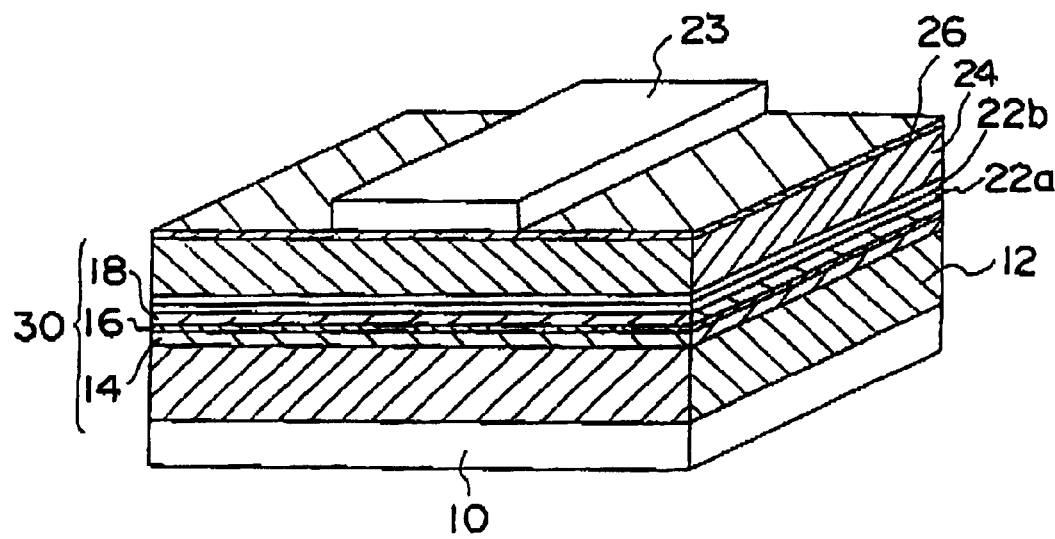
FIG. 12 is a schematic view after a first mask forming process in the method for manufacturing the surface emitting semiconductor laser in accordance with the second embodiment of the present invention.
Figure 13:
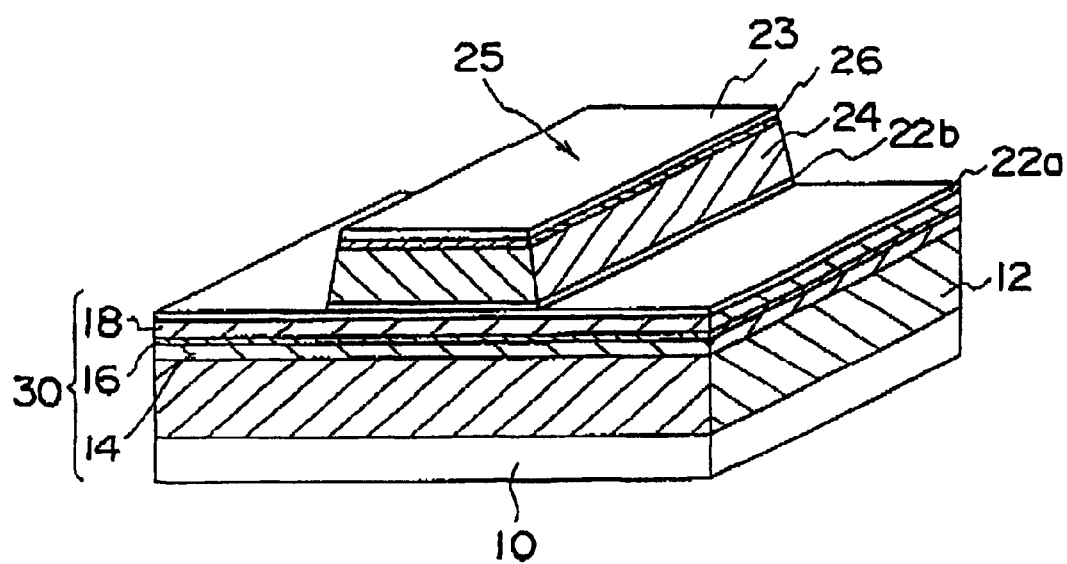
FIG. 13 is a schematic view after a first etching process in the method for manufacturing the surface emitting semiconductor laser in accordance with the second embodiment of the present invention.
Figure 14:
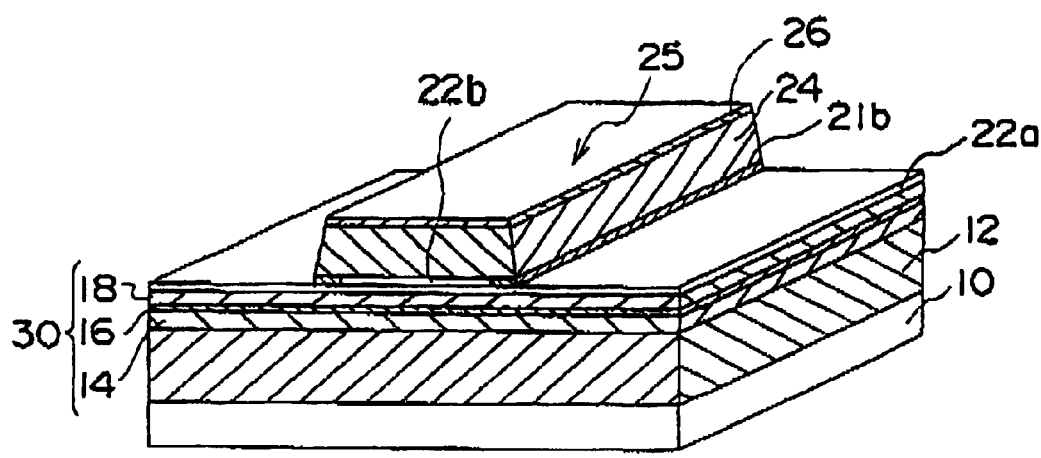
FIG. 14 is a schematic view after a first oxidation process in the method for manufacturing the surface emitting semiconductor laser in accordance with the second embodiment of the present invention .

Next, as shown in FIG. 12, a silicon insulating film is deposited on the entire surface of the n-type GaAs substrate 10 on which the above-mentioned layers have been formed in the form of layer, and then the silicon insulating film is partially removed to form residual rectangle having a width of 20 to 50 $\mu$m which includes the area to be finally the top surface of the post 20 by means of photolithography, which will be served as the first mask 23. Subsequently as shown in FIG. 13, the resultant laminate is subjected to reactive ion etching by use of the first mask 23 until the second AlAs layer 22b is exposed to the top surface or the side surface to form a ridge 25 having the mesa structure (etching process).

Next, the resultant laminate is subjected to heat treatment at 380° C. for 5 to 10 main in a quartz tube filled with steam. During the heat treatment, the second AlAs layer 22b exposed to the side of the ridge 25 is oxidized gradually toward the inside and the peripheral oxidized area 21b is formed on the outer periphery (first selective oxidation process).

Further, the silicon insulating film on the top surface of the ridge 25 is partially removed to form a residual square by means of photolithography, which will be served as the second mask 23. Subsequently, the resultant ridge 25 is subjected to reactive ion etching with use of the second mask 23 until the first AlAs layer 22a is exposed to the top surface or the side surface.

Figure 15:
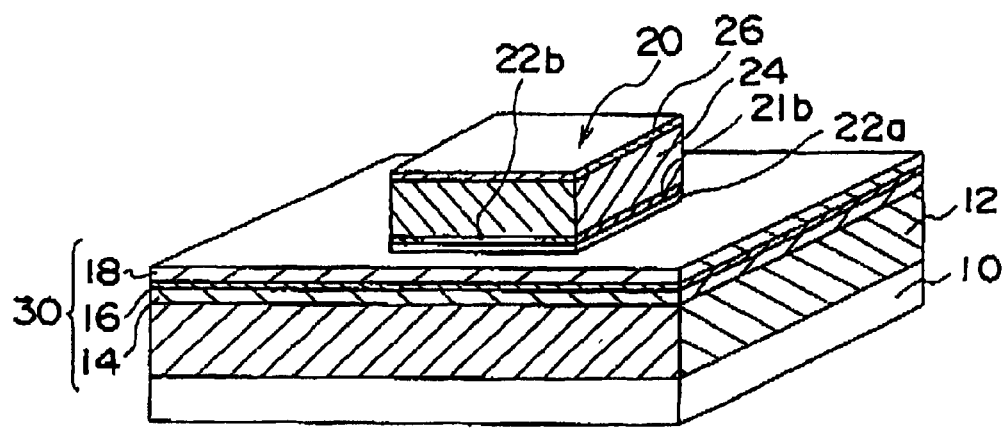
FIG. 15 is a schematic view after a second etching process in the method for manufacturing the surface emitting semiconductor laser in accordance with the second embodiment of the present invention.

The edge of the peripheral oxidized area 21b was exposed linearly in parallel to the main plane of the GaAs substrate 10 to the side surface of the ridge 25 before the post 20 was formed, and during the above-mentioned post forming process, the ridge 25 is etched so that the first AlAs layer 22a is also exposed to the four side surfaces and the ridge 25 including the peripheral oxidized area 21b is removed partially from the pair of facing two side surfaces out of the four side surfaces. As the result, as shown in FIG. 15, the square post 20 having the mesa structure is formed (post forming process).

On one pair of facing two side surfaces out of the four side surfaces on the post 20 obtained through the post forming process, the peripheral oxidized area 21b formed on the periphery of the second AlAs layer 22b and the edge thereof are exposed linearly in parallel to the main plane of the GaAs substrate 10, and the edge of the first AlAs layer 22a which is not oxidized is exposed linearly in parallel to the main plane of the GaAs substrate 10. On the other hand, on the other pair of facing two side surfaces of the post 20, the edge of the first AlAs layer 22a which is not oxidized is exposed linearly in parallel to the main plane of the GaAs substrate, and the edge of the peripheral oxidized area 21b is exposed.

Subsequently, the resultant laminate is subjected again to heat treatment at 380° C. for 5 to 10 minutes in a quartz tube filled with steam to selectively oxidize the first AlAs layer 22a and the second AlAs layer 22b which are exposed to the four side surfaces (second selective oxidation process)

Figure 16:
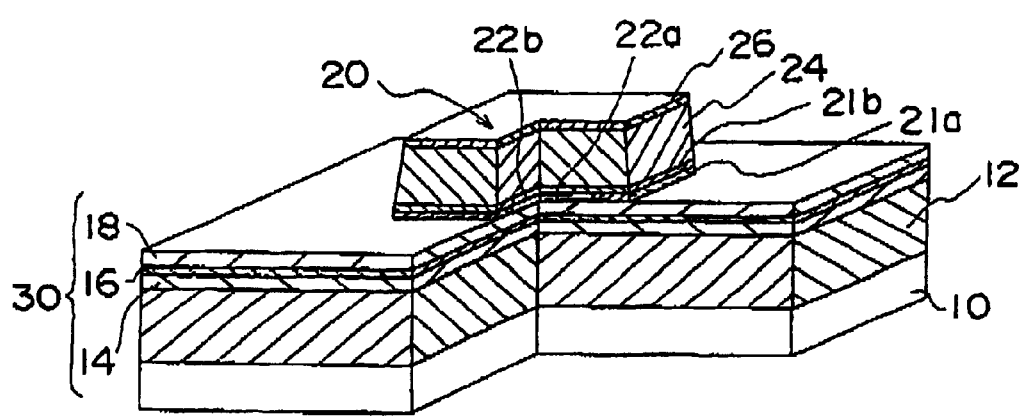
FIG. 16 is a schematic view after a second oxidation process in the method for manufacturing the surface emitting semiconductor laser in accordance with the second embodiment of the present invention.

During the second selective oxidation process, the first AlAs layer 22a and the second AlAs layer 22b which are exposed to the four side surfaces of the post 20 are oxidized gradually from the side surface to the inside as shown in FIG. 16. On the first AlAs layer 22a, which is not oxidized, the peripheral oxidized area having the same oxidation depth in the two axial directions orthogonal in the plane parallel to the main plane of the GaAs substrate 10 is formed.

Because the existing oxidized area of the second AlAs layer which has been subjected to oxidation is formed already on the edge of the second AlAs layer 22b exposed to one pair of facing two side surfaces of the post 20 out of the four side surfaces, the oxidation proceeds further during the second selective oxidation so that the oxidized area extends closely to the center of the post 20. On the other hand, there is some area which is not oxidized on the edge of exposed to the other pair of facing side surfaces of the second AlAs layer 22b formed newly during the post forming process out of the four side surfaces of the second AlAs layer 22b, and this area is oxidized newly and a new oxidized area is formed. The oxidation of the above-mentioned extended oxidized area is shallower than that of the new oxidized area. Accordingly, the peripheral oxidized area which is different in the oxidation depth between two axial directions orthogonal in the plane parallel to the main plane of the GaAs substrate 10 is formed on the second AlAs layer 22b.

Next, the p-side electrode 29, on which the aperture 2a is formed by means of photolithography for allowing the beam to come out upward from the top surface of the post 20 on the surface side of the GaAs substrate 10, is formed with interposition of the insulating protective film 27, and the n-side electrode 28 is formed on the entire back surface of the GaAs substrate 10 to obtain the surface emitting semiconductor layer having an oscillation wavelength of $\mu$ to 780 nm shown in FIG. 10.

In the first embodiment and the second embodiment described hereinbefore, the Al content of the AlAs layer which is the component of the peripheral oxidized area is higher than those of two types of films having different Al content ratios ($Al_{0.9}Ga_{0.1}As$ film and $Al_{0.3}Ga_{0.7}As$ film) which are components of the first reflection mirror layer and the second reflection mirror layer, however, the Al content of AlAs layer which is a component of the peripheral oxidized area may be 95% or higher, and more desirably 98% or higher because the effectiveness is obtained as long as the oxidation rate of the AlAs layer which is the peripheral oxidized area is different from that of the one AlAs layer having the higher Al content (herein, $Al_{0.9}Ga_{0.1}As$ film having 90% Al content) out of the above-mentioned two types of films during heat treatment.

In the first embodiment and second embodiment, high resistance of the peripheral area of the current narrowing layer is implemented by.selective oxidation of the peripheral area of the current narrowing layer, however, as for one of the two insertion layers, it is possible to form the high resistance peripheral area by applying a method in which a circular or square mask is formed on the conductive layer and the peripheral area is subjected to impurity ion injection.

The stress in the two axial directions is differentiated by applying a method in which overlapping of two peripheral oxidized areas in the view from the top of the laminate in one axial direction is differentiated from that in the other direction out of the arbitrary orthogonal two axial directions parallel to the main plane of the semiconductor substrate by differentiating the proportion of non-high resistance area of two insertion layers, particularly the shape in the plane parallel to the main plane of the semiconductor.

Particularly, the structure in which the peripheral area of the peripheral high resistance layer located farther from the active layer has high resistance area in different proportion between the arbitrary two axial directions orthogonal in the plane parallel to the main plane of the above-mentioned semiconductor (for example, the shape of the non-high resistance area is rectangular or ellipse) is formed, thereby enabling laser beam polarization plane control in a constant direction, and simultaneously the injection current distribution to the active area is made uniform and the horizontal mode stability is secured by use of a regular polygonal or regular circular non-high resistance area of the peripheral high resistance layer located nearer to the active layer in the plane parallel to the main plane of the semiconductor substrate differently from the shape of the peripheral high resistance layer located farther from the active layer.

In the above-mentioned first embodiment and the second embodiment, the same AlAs content is used for the layers which are components of the peripheral oxidized areas, however, the composition is by no means limited to this composition, and instead the layer of different combination of material consisting of other material having a high Al content which is more easily oxidized than surrounding semiconductor layers, for example, combination of AlAs and AlGaAs or combination of AlAs and AlGaInP, may be used. Particularly because in the second embodiment, it is required that etching is stopped at the desired depth when these insertion layers are exposed to the atmosphere by etching, it is preferable that the etching selective ratio is differentiated between two insertion layers, and selection of the material system according to such requirement is useful for easier processing and improvement of the element yield.

Because it is generally suspected that the element resistance of p-type layer due to band discontinuity increases more significantly than that of n-type layer, the conduction type of the coming-out side reflection mirror layer, which comprises less number of layers out of two mirror layers located facing each other, is formed in p-type in the first embodiment and the second embodiment, however, the conduction type is by no means limited to this type, and instead, it is possible to reverse the conduction type.

The structure in which the beam comes out from the top side where the post 20 is formed is employed in the first embodiment and second embodiment, however, the structure in which the beam comes out from the bottom side may be employed. In this case, it is preferable that the conduction type of the reflection mirror layer formed on the GaAs substrate side is p-type and the conduction type of the reflection mirror layer formed on the post 20 is n-type.

GaAs/AlGaAs semiconductor is used as the material of the quantum well active layer in the above-mentioned first embodiment and the second embodiment, however, the material is by no means limited to this material, and instead for example, a GaAs/InGaAs or InP/InGaAsP semiconductor may be used for the quantum well active layer. The GaAs substrate is permeable to the oscillation wavelength emitted from these quantum well layers, the beam which comes out from the back side of the semiconductor is easily taken out, and complexity in the process is reduced.

The post is a pole having a square top surface in the above-mentioned first embodiment and the second embodiment, however, of course the shape is by no means limited to this shape, and instead the post may be a pole having a rectangular, rhomboid, or ellipse top surface. In the case that the top shape has the major axis and minor axis such as rectangle, rhomboid, or ellipse, it is desirable that the major axial direction and minor axial direction correspond respectively to the above-mentioned orthogonal two axial directions because the polarization plane is further stabilized. The pole described in the present invention is by no means limited to a pole having the top and the bottom of the same size, and includes a pole having the top smaller than the bottom or having the top larger than the bottom.

The heating temperature for selective oxidation of 380° C. is used for forming the peripheral oxidized area, however, the heating temperature is by no means limited to this temperature, and any temperature which is suitable for controlling the final size of the current path to a desired value may be used. A higher temperature results in faster oxidation rate, and a desired oxidized area can be formed within a short time, but the temperature around 400° C. is preferably used because the oxidized distance can be controlled very easily.

The number of layers which are components of the peripheral oxidized areas is two in the above-mentioned first embodiment and the second embodiment, however, the number is by no means limited two, and may be three or more.

The etching process in which a rectangular ridge is formed and the post is formed is described in the above-mentioned first embodiment and the second embodiment, however, the etching process is by no means limited to this etching process, and the stress different between the two axial directions may be generated during the second selective oxidation by applying an etching process in which a ridge of a shape having the major axis and the minor axis corresponding respectively to one axis and the other axis of the arbitrary two axial directions orthogonal in the plane parallel to the main plane of the above-mentioned semiconductor substrate is formed and the major axis side is removed in the post forming process.

It is not necessarily to remove both ends of the ridge in the major axis direction during the post forming process, and only one end may be removed as long as the stress is differentiated between the two axial directions.

Third Embodiment

Figure 17:
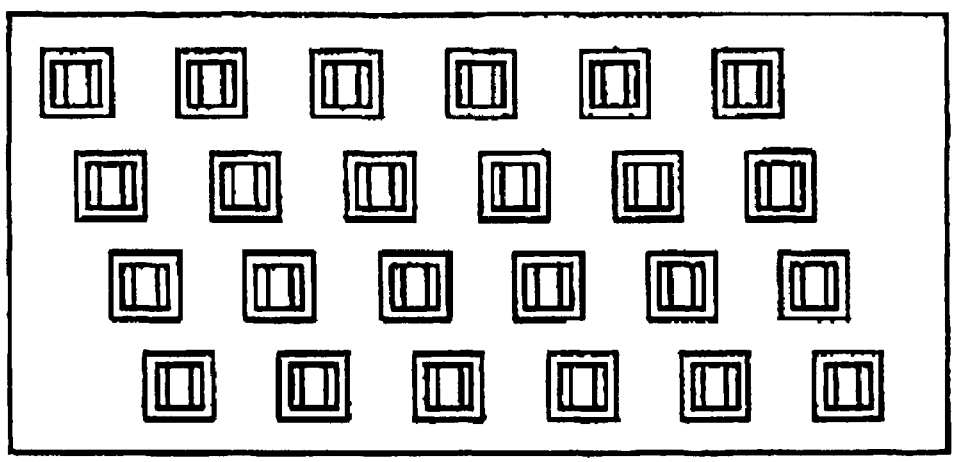
FIG. 17 is a conceptual view of a two-dimensional array structured by use of surface emitting semiconductor lasers of the present invention.

The third embodiment of the present invention is an example of a two-dimensional surface emitting semiconductor laser array to which the above-mentioned surface emitting semiconductor laser is applied, and as shown in FIG. 17, a plurality of above-mentioned surface emitting semiconductor laser elements are arranged on a substrate to structure a surface emitting semiconductor laser array.

In the surface emitting semiconductor laser array, grooves or high resistance areas may be provided between elements to electrically separate the elements. Elements are arranged two-dimensionally in the third embodiment, however, elements may be arranged one-dimensionally. The driving type of elements may be independent driving type, matrix driving type, or simultaneous driving type.

The method for manufacturing the surface emitting semiconductor laser of the present invention is featured in that the process includes two selective oxidation processes and two etching processes, and is used preferably for manufacturing a surface emitting semiconductor laser provided with two or more peripheral high resistance layers having high resistance periphery inserted between the above-mentioned first reflection mirror layer and the above-mentioned second reflection mirror layer and having the structure in which the shapes of non-high resistance areas are different from each other in the plane parallel to the main plane of the above-mentioned semiconductor substrate, and further used preferably f or manufacturing a surf ace emitting semiconductor laser having a single peripheral high resistance layer.

Figure 18A:
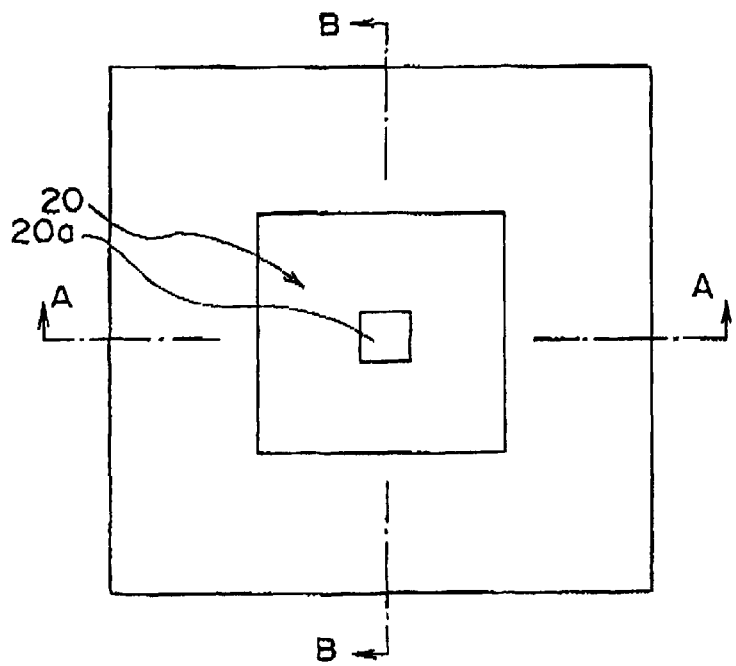
FIG. 18 (a) is a top view of a surface emitting semiconductor laser having a single peripheral high resistance layer.
Figure 18B:
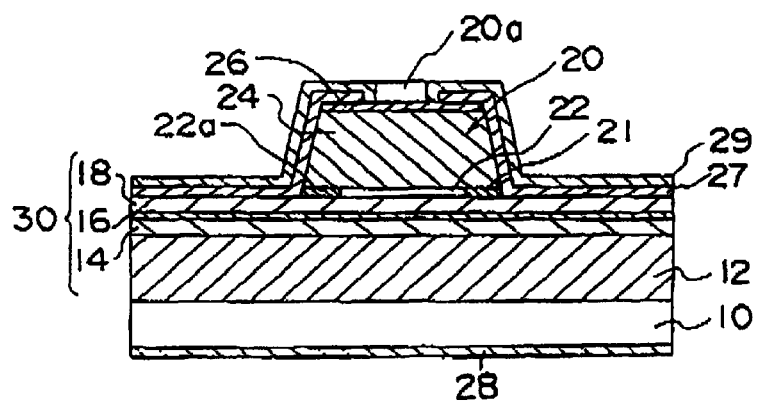
Figure 18C:
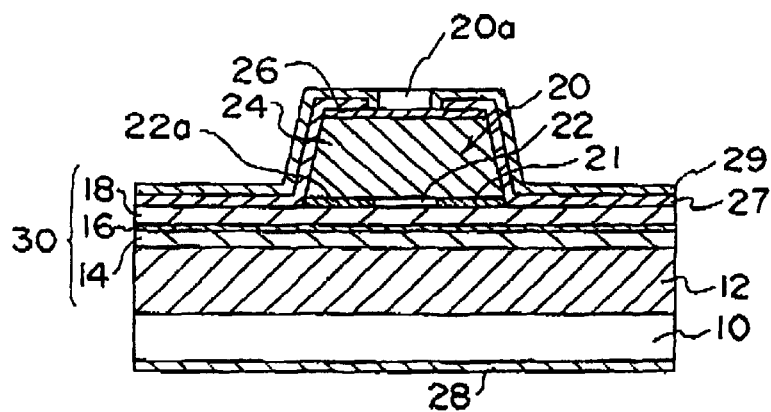

For example, the manufacturing method may be preferably applied to a surface emitting semiconductor laser having a single peripheral high resistance layer shown in FIG. 18. FIG. 18 shows a surface emitting semiconductor laser having a single peripheral high resistance layer, and FIG. 19 to FIG. 24 show the outline of the manufacturing process of the surface emitting semiconductor laser.

As shown in FIG. 18($a$), the surface emitting semiconductor laser of the third embodiment is a rectangular element provided with a square post 20 on the top center having an aperture 2$a$ on the top side for allowing the beam to come out, and as shown in FIG. 18($b$) an FIG. 18($c$), on an n-type GaAs,substrate 10 provided with an n-side electrode 28 on the back side thereof, the n-type first reflection mirror layer 12 obtained by a process in which n-type $Al_{0.9}Ga_{0.1}As$ films having a thickness of $\lambda/(4n_r)$ ($\lambda$: oscillation wavelength, $n_r$: refractive index of the medium) and n-type $Al_{0.3}Ga_{0.7}As$ films of $\lambda/(4n_r)$ in thickness (though not shown in detail) are formed alternately in the form of layer with interposition of intermediate layers having an Al content between those of the above-mentioned two films up to approximately 40.5 periods and then doped with n-type impurity Si (silicon) to the concentration of $2\times10^{18}$ $cm^{-3}$.

On the top side of the n-type first reflection mirror layer 12, the first spacer layer 14 consisting of n-type $Al_{0.5}Ga_{0.5}As$, further on the top side of the first spacer layer 14, a quantum well active layer 16 comprising four undoped $Al_{0.3}Ga_{0.7}As$ barrier films of 5 nm in thickness and three undoped $Al_{0.11}Ga_{0.8}9As$ films formed alternately in the form of layer. Further on the top side of the quantum well active layer 16, the second spacer layer 18 consisting of p-type $Al_{0.5}Ga_{0.5}As$ is provided, and thus the above-mentioned first spacer layer 14 and the above-mentioned second spacer layer 18 are laminated with interposition of the quantum well active layer 16 to form an active layer 30.

The thickness of the active layer 30 is adjusted to an integral multiple of $\lambda/n_r$ to obtain standing wave. As the result, the antinode where the optical intensity is maximum is positioned at the quantum well active layer 16 when the surface emitting semiconductor laser is operated.

The approximately square post 20 is provided on the top side of the second spacer layer 18. The post 20 comprises an AlAs peripheral oxidized layer 22 having the periphery which is oxidized in different proportion between the two axial directions orthogonal in the plane parallel to the main plane of the n-type GaAs substrate 10, the p-type second reflection mirror layer 24 obtained by a process in which p-type $Al_{0.9}Ga_{0.1}As$ films of $\lambda/(4r_r)$ in thickness and p-type $Al_{0.3}Ga_{0.7}As$ films of $\lambda/(4n_r)$ in thickness (though not shown in detail) are laminated alternately with interposition of intermediate layers having an Al content between those of the above-mentioned two films up to 30 periods and subsequently doped with C (carbon) to the concentration of $3\times10^{-8}$ $cm^{-3}$, and a p-type GaAs contact layer 26 of 5 nm in thickness obtained by doping with C (carbon) to the concentration of $1\times10^{20}$ $cm^{-3}$.

The Al content of the AlAs peripheral oxidized layer 22 is prescribed to be higher than those of the $Al_{0.9}Ga_{0.1}As$ film and $Al_{0.3}Ga_{0.7}As$ film which are components of the p-type second reflection mirror layer 24 to render it susceptible to oxidation, and as shown in FIG. 18($b$) and FIG. 18($c$), the Al As peripheral oxidized layer 22 comprises an AlGaAs film having the peripheral area 21 oxidized differently between the two axial directions orthogonal in the plane parallel to the main plane of the GaAs substrate 10.

The number of periods (number of layers) of the p-type second reflection mirror layer 24 formed on the top side of the AlAs peripheral oxidized layer 22 is prescribed to be smaller than that of the above-mentioned n-type first reflection mirror layer to render the p-type second reflection mirror layer 24 less reflective than the n-type first reflection mirror layer. The difference in reflectance allows the beam to come out from the top surface of the post 20. The intermediate layer provided between the p-type $Al_{0.9}Ga_{0.1}As$ film and the p-type $Al_{0.3}Ga_{0.7}As$ film which are components of the p-type second reflection mirror layer 24 functions to reduce the series resistance of the element. Further, the p-type GaAs contact layer 26 formed on the uppermost position is formed to keep in contact with the p-side electrode 29 provided with interposition of the insulating film 27.

The manufacturing process of a surface emitting semiconductor laser having the structure described hereinabove is described with reference to FIG. 19 to FIG. 24.

Figure 19:
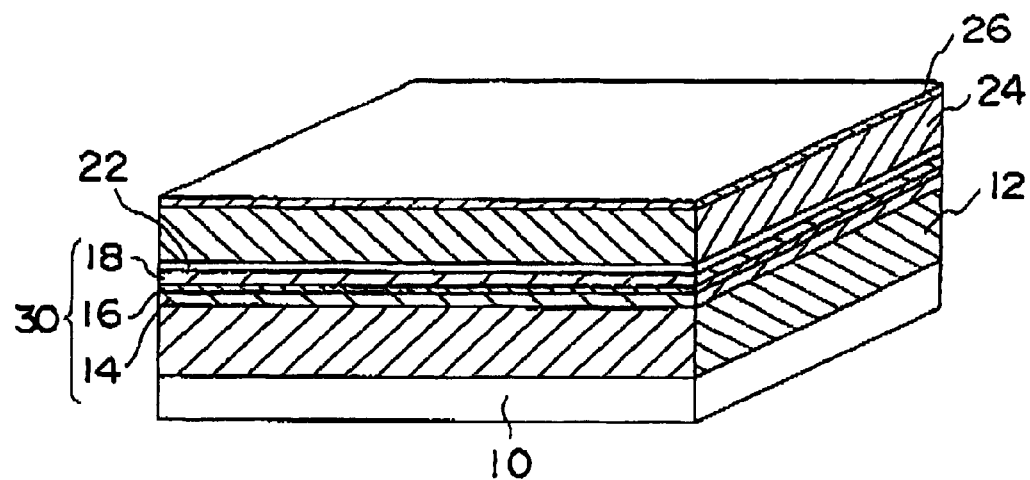
FIG. 19 is a schematic view after a lamination process in a method for manufacturing the surface emitting semiconductor laser having a single peripheral high resistance layer.

As shown in FIG. 19, on the GaAs substrate 10, the n-type first reflection mirror layer 12 formed by a process in which the n-type $Al_{0.3}Ga_{0.1}As$ film (not shown in the drawing) and the n-type $Al_{0.3}Ga_{0.7}As$ film (not shown in the drawing) are laminated alternately with interposition of the intermediate layer (not shown in the drawing) and subsequently doped with Si (silicon), the active layer 30 comprising the first spacer layer 14 consisting of n-type $Al_{0.5}Ga_{0.5}As$ and the second spacer layer 18 consisting of p-type $Al_{0.5}Ga_{0.5}As$ with interposition of the quantum well active layer 16, the AlAs film 22 having an Al content higher than those of the p-type $Al_{0.9}Ga_{0.1}As$ film (not shown in the drawing) and the $Al_{0.3}Ga_{0.7}As$ film (not shown in the drawing) which are components of the p-type second reflection mirror layer 24, which will be described hereunder, the p-type second reflection mirror layer 24 formed by a process in which p-type $Al_{0.9}Ga_{0.1}As$ films and p-type $Al_{0.3}Ga_{0.7}As$ films are laminated alternately with interposition of intermediate layers and subsequently doped with C (carbon), and the p-type GaAs contact layer 26 doped with C (carbon) are formed successively in the form of layer by means of semiconductor crystal growing technology such as organometal vapor phase deposition (MOCVD) or molecular beam epitaxy (MBE) (lamination process).

Figure 20:
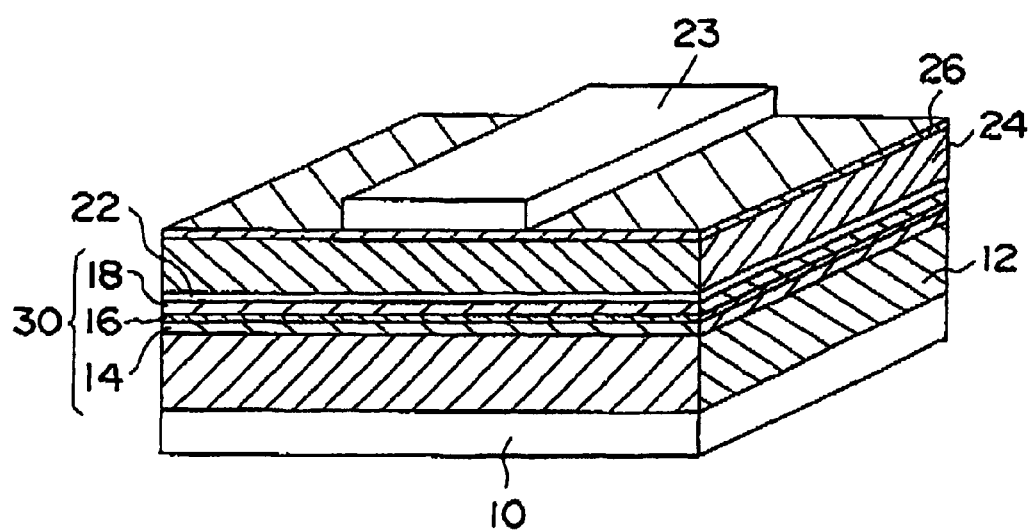
FIG. 20 is a schematic view after a first mask forming process in a method for manufacturing the surface emitting semiconductor laser having a single peripheral high resistance layer.
Figure 21:
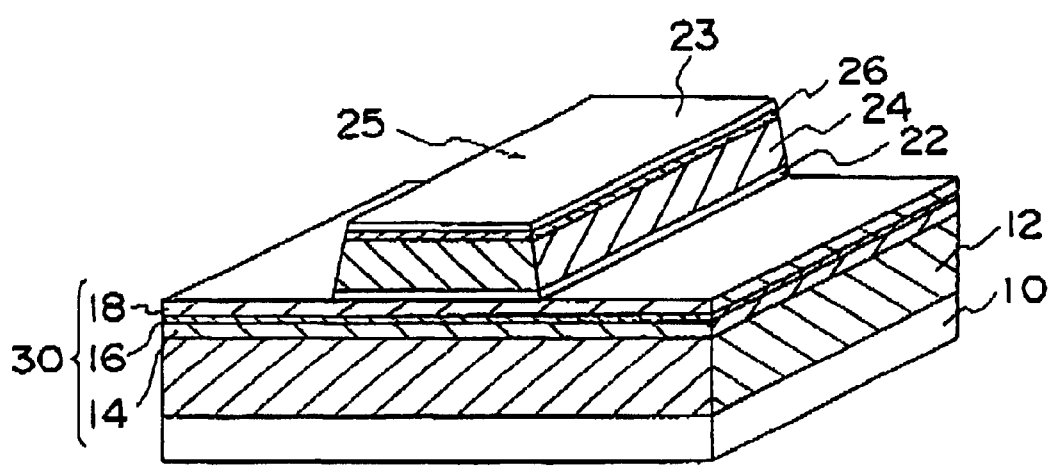
FIG. 21 is a schematic view after an etching process in a method for manufacturing the surface emitting semiconductor laser having a single peripheral high resistance layer.

Next, as shown in FIG. 20, silicon insulating film is deposited on the entire surface of the n-type GaAs substrate 10 on which the above-mentioned layers are laminated, and subsequently the silicon insulating film is removed partially to form a residual rectangle having a width of 20 to 50 $\mu m$ including the area which will be finally the top surface of the post 20 by means of photolithography, which area will be served as the first mask 23. As shown in FIG. 21, the resultant laminate is etched with aid of the first mask 23 by means of reactive ion etching until the AlAs film 22 is exposed to the side surface, and subsequently the first mask is removed to form an approximately cuboid ridge 25 having the four sides of mesa structure (etching process).

Figure 22:
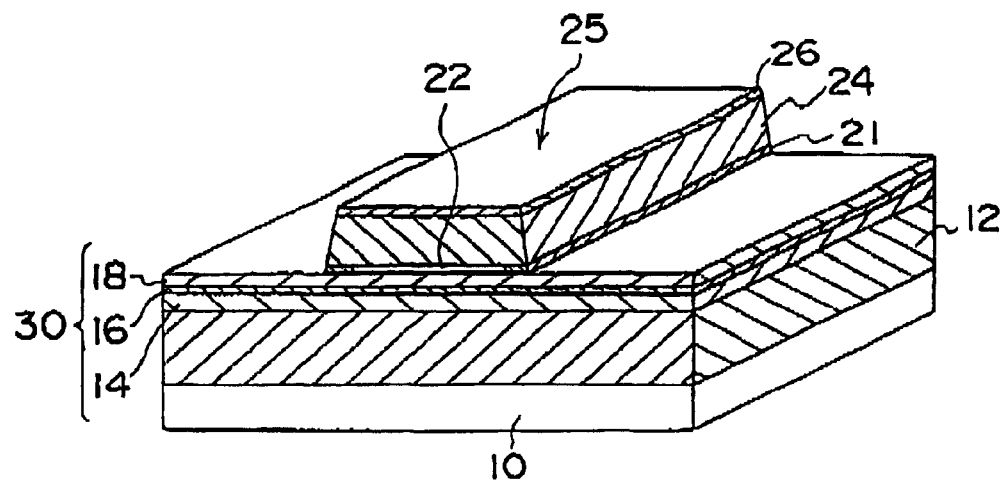
FIG. 22 is a schematic view after a first oxidation process in a method for manufacturing the surface emitting semiconductor laser having a single peripheral high resistance layer.

Next, the resultant laminate is heated up to 380° C. for 5 to 10 minutes in a quartz tube filled with steam. As the result, as shown in FIG. 22, the AlAs film 22 which is exposed to the side surface of the approximately cuboid ridge 25 is oxidized gradually from the surface of the four sides to the inside at the same rate and the insulating area 21 is formed (first selective oxidation process).

Silicon insulating film is deposited again on the entire surface and subsequently the silicon insulating film on the top of the ridge 25 is removed partially to form a residual square by means of photolithography. At this time, the silicon insulating film on the surface of the second spacer layer 18 remains unremoved, and which is served as a surface protective film for protecting the second spacer layer 18 so that the surface of the second spacer layer 18 is not removed.

Figure 23:
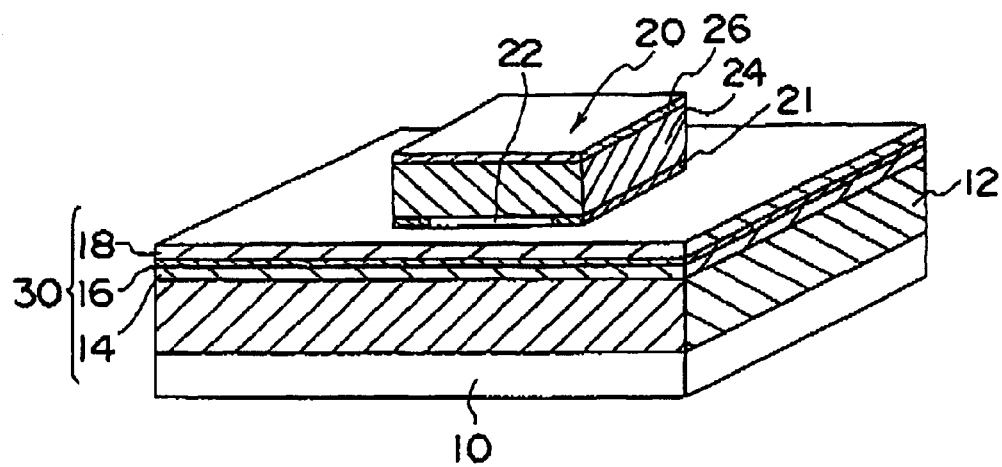
FIG. 23 is a schematic view after a post forming process in a method for manufacturing the surface emitting semiconductor laser having a single peripheral high resistance layer.

The approximately cuboid ridge 25 is etched with aid of the square residual silicon insulating film as the second mask (not shown in the drawing) by means of reactive ion etching, and subsequently the second mask (not shown in the drawing) is removed to form the square post 20 having the four sides of mesa structure as shown in FIG. 23 (post forming process)

The edge of the insulating area 21 is exposed linearly in parallel to the main plane of the GaAs substrate 10 on the four sides of the approximately cuboid ridge 25 before the post 20 is formed, but during the above-mentioned post forming process, the approximately cuboid ridge 25 is removed partially from the pair of facing two sides out of the four sides including the insulating area 21, therefore the end of the insulating area 21 is exposed linearly in parallel to the main plane of the GaAs substrate 10 on one pair of facing two sides out of four sides of the post 20 obtained during the post forming process, on the other hand, the edge of the insulating area 21 having the center area which is not oxidized is exposed on the other pair of facing two sides of the post 20.

Next, the resultant laminate is heated up to 380° C. for 5 to 10 minutes in a quartz tube filled with steam to selectively oxidize the AlAs film 22 which is exposed on the d- four side surfaces (second selective oxidation process).

Figure 24:
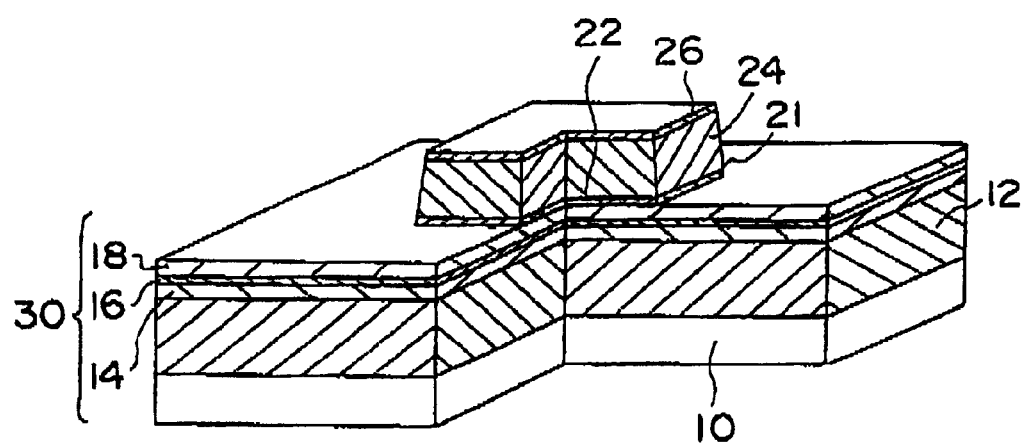
FIG. 24 is a schematic view after a second oxidation process in a method for manufacturing the surface emitting semiconductor laser having a single peripheral high resistance layer.
Figure 25:
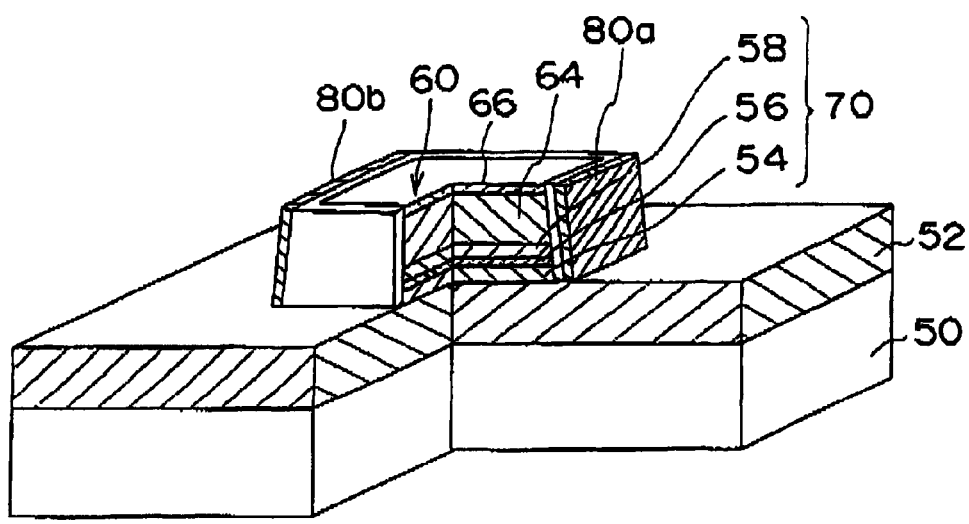
FIG. 25 is a partially cut-away perspective view of a conventional surface emitting semiconductor laser.
Figure 26A:
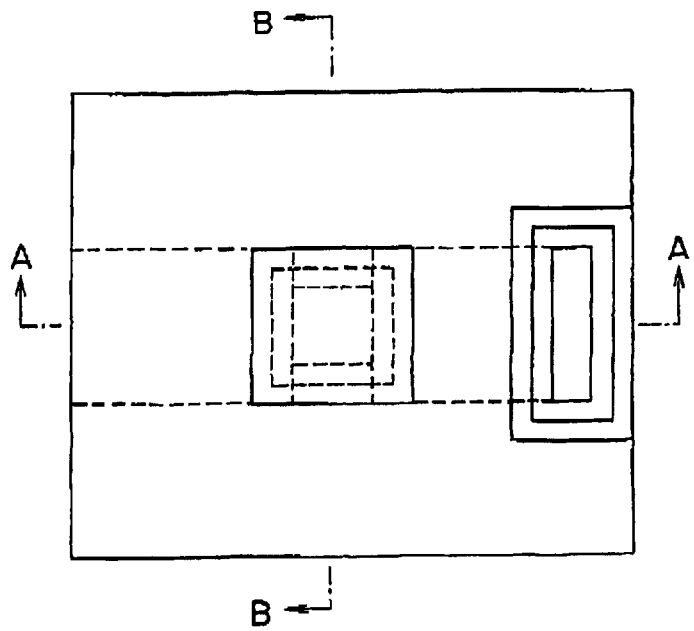
FIG. 26 (a) is a top view of a conventional surface emitting semiconductor laser having another structure.
Figure 26B:
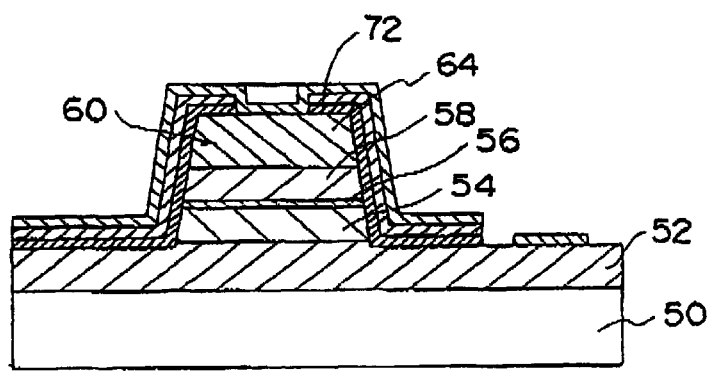
Figure 26C:
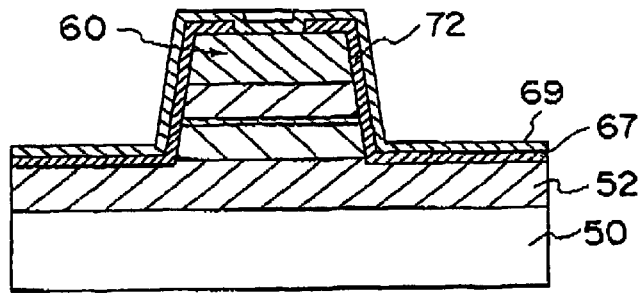

During the second selective oxidation process, as shown in FIG. 24, the AlAs film 22 which is exposed to the four side surfaces of the post 20 is oxidized gradually from the side surface to the inside at the same rate, wherein, the sides where the insulating area 21 has been formed linearly in parallel to the main plane of the GaAs substrate 10 exposed to one pair of facing two sides of the post 20 is oxidized further, and the insulating area 21 extends closely to the center of the post 20. There has been unoxidized area on the other pair of facing two sides formed newly during the post forming process out of the four sides of the post 20, and the unoxidized area is oxidized newly to form the new oxidized area. This oxidized area of the other pair of facing two sides is narrower than the oxidized area formed on one pair of facing two sides. As the result, the peripheral oxidized area different in depth of oxidation between the two axial directions orthogonal in the plane parallel to the main plane of the GaAs substrate 10 is formed on the GaAs film 22.

Next, the p-side electrode 29 having the aperture 20a for allowing the beam to come out from the top surface of the post 20 is formed on the top side of the GaAs substrate 10 with interposition of the insulating film 27 by means of photolithography and the n-side electrode 28 is formed on the entire surface of the back side of the GaAs substrate, and thus the surface emitting semiconductor laser having an oscillation wavelength of λ to 780 nm as shown in FIG. 18 is obtained.

As described hereinbefore, because the surface emitting semiconductor laser of the present invention described in claim 1 to claim 6 is provided with plurality of peripheral high resistance layers having the periphery of high resistance inserted between the above-mentioned first reflection mirror layer and the above-mentioned second reflection mirror layer, and at least two layers out of which plurality of peripheral high resistance layer are different in proportion of non-high resistance in the structure to give the stress which is different in magnitude between the above-mentioned orthogonal two axial directions to the active layer, such structure brings about the anisotropy in oscillation threshold gain and only the mode in the axial direction of low threshold gain is obtained selectively. Thus, the effect that the polarization plane of the laser beam of the surface emitting semiconductor laser is controlled in the constant direction is attained. Further, because the oxidized area of the peripheral oxidized area forms a refractive index waveguide, the effect that the low threshold current performance of the surface emitting semiconductor laser element is improved is attained.

Because the surface emitting semiconductor laser array described in claim 7 is a surface emitting semiconductor laser array formed by arrangement of a plurality of surface emitting semiconductor lasers described in any one of claim 1 to claim 5 on the above-mentioned same semiconductor substrate, variation of the polarization plane between elements is reduced and variation of light quantity is reduced.

Because the method for manufacturing the surface emitting semiconductor laser described in claim 8 to claim 12 involves a manufacturing process in which one pair of facing two sides of the post to be obtained finally is subjected to selective oxidation twice and on the other hand the other pair of facing two sides is subjected to selective oxidation only once, the effect is attained that the surface emitting semiconductor laser provided with plurality of peripheral high resistance layer having peripheries different in proportion of high resistance area in the plane parallel to the main plane of the semiconductor substrate of the post is manufactured easily.

What is claimed is:

1. A surface emitting semiconductor laser, comprising:
a semiconductor substrate;
a first reflection mirror layer of the first conduction type formed on the main plane of the semiconductor substrate;
an active layer having a quantum well laminated above the first reflection mirror layer;
a post having a second reflection mirror layer of the second conduction type different from the first conduction type for constituting a resonator structure together with the first reflection mirror;
at least a first peripheral high resistance layer and a second peripheral high resistance layer having a periphery of high resistance and inserted between the first reflection mirror layer and the second reflection mirror layer;
at least the first peripheral high resistance layer and the second peripheral high resistance layer are made to be highly resistant by oxidation;
at least the first peripheral high resistance layer has the periphery of high resistance which is different in proportion between arbitrary two axial directions orthogonal in a plane parallel to a main plane of the semiconductor substrate; and
a shape of the non-high resistance area of at least the second peripheral high resistance layer in the plane parallel to the main plane of the semiconductor substrate is a regular polygon or a regular circle.

2. The surface emitting semiconductor laser as claimed in claim 1, wherein a shape of the post part within the plane parallel to the main surface of the semiconductor substrate is a regular polygon or a regular circle.

3. The surface emitting semiconductor laser according to claim 1, wherein at least one of the first peripheral high resistance layer and the second peripheral high resistance layer is an isotropic peripheral high resistance layer and at least one of the first peripheral high resistance layer and the second peripheral high resistance layer is an anisotropic peripheral high resistance layer, wherein the at least one isotropic peripheral high resistance layer is positioned in a layer in the vicinity of an active layer, and the at least one anisotropic peripheral high resistance layer is in a layer at a position sandwiching the isotropic peripheral high resistance layer with respect to the active layer.

4. The surface emitting semiconductor laser according to claim 1, wherein the second peripheral high resistance layer is closer to the active layer.

5. The surface emitting semiconductor laser according to claim 1, wherein a width of the periphery of high resistance of at least the first peripheral high resistance layer is different along any two axial directions orthogonal in a plane parallel to a main plane of the semiconductor substrate.

6. The surface emitting semiconductor laser according to claim 5, wherein along any two axial directions orthogonal in a plane parallel to a main plane of the semiconductor substrate, the periphery of high resistance of at least the first peripheral high resistance layer has different resistivity.

7. A surface emitting semiconductor laser array comprising a plurality of surface emitting semiconductor lasers arranged on a semiconductor substrate, each semiconductor laser comprising:

a first reflection mirror layer of the first conduction type formed on the main plane of the semiconductor substrate, an active layer having a quantum well laminated above the first reflection mirror layer;

a post having a second reflection mirror layer of the second conduction type different from the first conduction type for constituting a resonator structure together with the first reflection mirror;

at least a first peripheral high resistance layer and a second peripheral high resistance layer having a periphery of high resistance and inserted between the first reflection mirror layer and the second reflection mirror layer;

at least the first peripheral high resistance layer and the second peripheral high resistance layers are made to be highly resistant by oxidation;

at least the first peripheral high resistance layer has the periphery of high resistance which is different in proportion between two arbitrary axial directions orthogonal in a plane parallel to a main plane of the semiconductor substrate; and a shape of the non-high resistance area of at least the second peripheral high resistance layer in the plane parallel to the main plane of the semiconductor substrate is a regular polygon or a regular circle.

8. The surface emitting semiconductor laser as claimed in claim 7, wherein the shape of the post in the plane parallel to the main surface of the semiconductor substrate is only a regular polygon or a regular circle.

9. The surface emitting semiconductor laser as claimed in claim 7, wherein at least one of the first peripheral high resistance layer and the second peripheral high resistance layer is an isotropic peripheral high resistance layer and at least one of the first peripheral high resistance layer and the second peripheral high resistance layer is an anisotropic peripheral high resistance layer, wherein the at least one isotropic peripheral high resistance layer is positioned in a layer in the vicinity of an active layer, and the at least one anisotropic peripheral high resistance layer is in a layer at a position sandwiching the isotropic peripheral high resistance layer with respect to the active layer.

10. The surface emitting semiconductor laser according to claim 7, wherein the second peripheral high resistance layer is closer to the active layer.

11. The surface emitting semiconductor laser according to claim 7, wherein a width of the periphery of high resistance of at least the first peripheral high resistance layer is different along any two axial directions orthogonal in a plane parallel to a main plane of the semiconductor substrate.

12. The surface emitting semiconductor laser according to claim 11, wherein along any two axial directions orthogonal in a plane parallel to a main plane of the semiconductor substrate, the periphery of high resistance of at least the first peripheral high resistance layer has different resistivity.

* * * * *